(12) United States Patent
Matsui et al.

(10) Patent No.: US 7,663,869 B2
(45) Date of Patent: Feb. 16, 2010

(54) DISPLAY UNIT

(75) Inventors: Seiji Matsui, Sagamihara (JP); Yoichiro Okoshi, Kamikura (JP); Yasuki Sato, Ashigarakami (JP); Tadayuki Ito, Ashigaragami (JP)

(73) Assignee: NEC Display Solutions, Ltd., Tokyo (JP)

( * ) Notice: Subject to any disclaimer, the term of this patent is extended or adjusted under 35 U.S.C. 154(b) by 192 days.

(21) Appl. No.: 11/645,385

(22) Filed: Dec. 26, 2006

(65) Prior Publication Data

US 2008/0120812 A1  May 29, 2008

(30) Foreign Application Priority Data

Dec. 27, 2005  (JP)  ............................ 2005-374065

(51) Int. Cl.
*H05K 5/00*  (2006.01)

(52) U.S. Cl. .................................... 361/679.21; 16/430

(58) Field of Classification Search ................ 361/681, 361/679.21; 16/430, 443, 444
See application file for complete search history.

(56) References Cited

U.S. PATENT DOCUMENTS

| 4,138,765 | A | * | 2/1979 | Yamazaki et al. | ............. 16/412 |
| 4,634,004 | A | * | 1/1987 | Mortensen | ............. 206/387.11 |
| 6,262,785 | B1 | * | 7/2001 | Kim | ............. 349/58 |
| 6,560,092 | B2 | * | 5/2003 | Itou et al. | ............. 361/681 |
| 2006/0076463 | A1 | * | 4/2006 | Drew | ............. 248/121 |

FOREIGN PATENT DOCUMENTS

| JP | A 2000-228585 | 8/2000 |
| JP | A 2005-266396 | 9/2005 |
| JP | 2006250481 A * | 9/2006 |

* cited by examiner

*Primary Examiner*—Kayprakash N Gandhi
*Assistant Examiner*—Ingrid Wright
(74) *Attorney, Agent, or Firm*—Scully, Scott, Murphy & Presser, P.C.

(57) ABSTRACT

The display unit of the present invention includes a metal reinforcing component that reinforces a handle portion that is formed integrally with a rear surface side of a synthetic resin housing and has a finger insertion space provided on a bottom side thereof. As a result, strength can be secured without the thickness of the handle plate portion being made thicker.

7 Claims, 2 Drawing Sheets

DISPLAY UNIT

BACKGROUND OF THE INVENTION

1. Field of the Invention

The present invention relates to a display unit and particularly to an improvement in a handle portion that is used when a display unit is being carried and the like.

Priority is claimed on Japanese Patent Application No. 2005-374065, filed Dec. 27, 2005, the contents of which are incorporated herein by reference.

2. Description of Related Art

Among display units there are those that have a handle portion provided on a rear surface thereof that is used when the display unit is being carried or the like (see, for example, Japanese Unexamined Patent Application, First Publication, (JP-A) No. 2005-266396). The person who is doing the carrying or the like lifts the display unit by inserting a finger in a finger insertion space located on a bottom side of the handle portion and gripping the handle portion.

In some cases, this type of handle portion is formed integrally with a housing of the display unit that is made of synthetic resin. In such cases, in order to ensure the strength of the synthetic resin handle portion, it is necessary for the handle portion to have sufficient thickness and this has led to the possibility that the degree of freedom in design will be restricted.

SUMMARY OF THE INVENTION

Accordingly, it is an object of the present invention to provide a display unit that makes it possible to improve the degree of freedom in design by enabling a handle portion to be made thinner.

In order to achieve the above described object, in the display unit of the present invention, a handle portion that is formed integrally with a rear surface side of a housing that is made from synthetic resin and that has a finger insertion space provided in a bottom side thereof is reinforced by a reinforcing component that is made of metal.

In the display unit of the present invention, it is preferable for the reinforcing component to be provided at a bottom surface side of the handle portion.

In the display unit of the present invention, it is preferable for there to be further provided a step portion that is formed on an interior side of the bottom surface of the handle portion and has a step shape on its upper side, and for the reinforcing component to be placed in the step portion.

In the display unit of the present invention, it is preferable for a non-slip portion to be provided on a bottom surface of the reinforcing component.

In the display unit of the present invention, it is preferable for the reinforcing component to be mounted on the housing.

In the display unit of the present invention, it is preferable for the reinforcing component to be fixed to an internal chassis that is made of metal and is provided inside the housing.

In the display unit of the present invention, it is preferable for the handle portion to be formed at a position on a top surface of the housing so as to form a single plate shape.

According to the present invention, because a handle portion that is made of synthetic resin and is formed integrally with a housing is reinforced by a reinforcing component that is made of metal, strength can be secured without the thickness of the handle portion being made thicker. Accordingly, the handle portion can be made thin and the degree of freedom of design is improved. Moreover, a reduction in the space that is required for the handle portion is achieved. In addition, because reinforcement is provided by the metal reinforcing component, any cost increases can be controlled.

DETAILED DESCRIPTION OF THE INVENTION

A display unit of an embodiment of the present invention is described below with reference made to the drawings.

Figure 1:
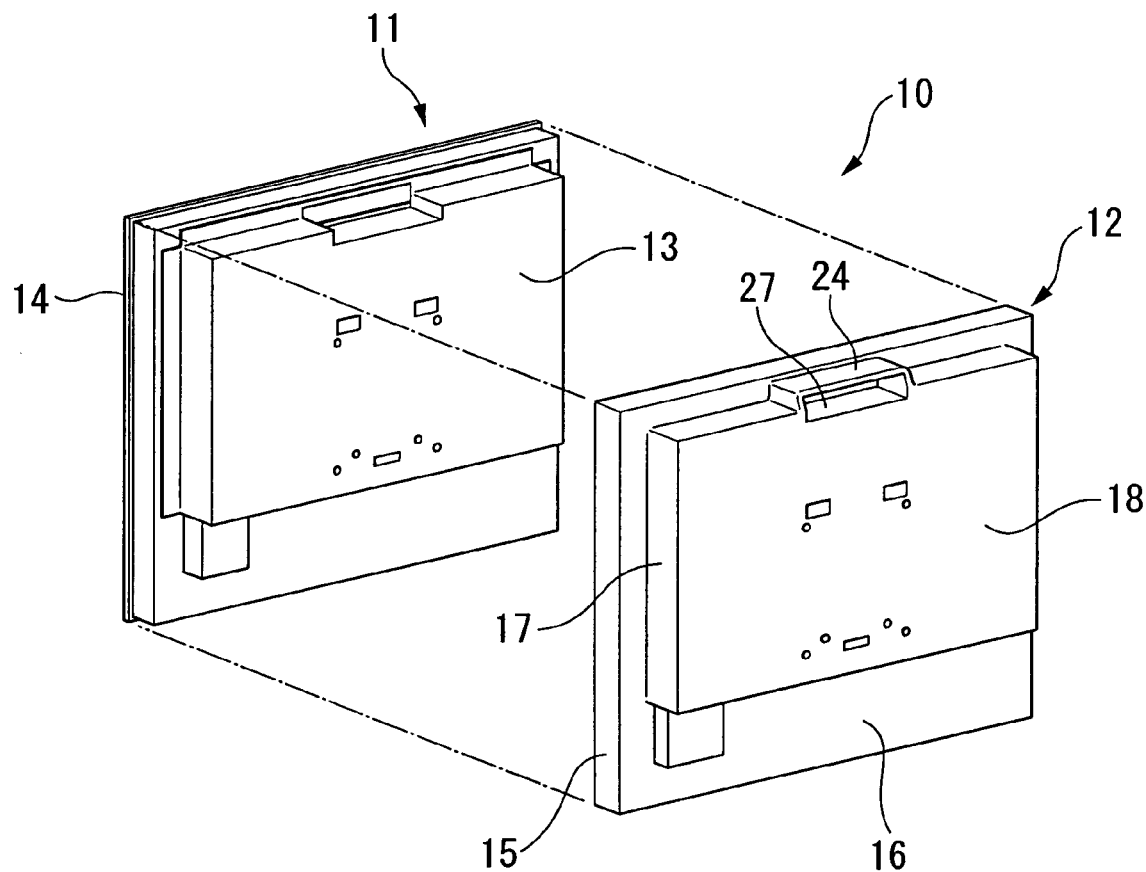
FIG. 1 is an exploded perspective view showing a display unit of an embodiment of the present invention as viewed from a rear surface side.
Figure 2:
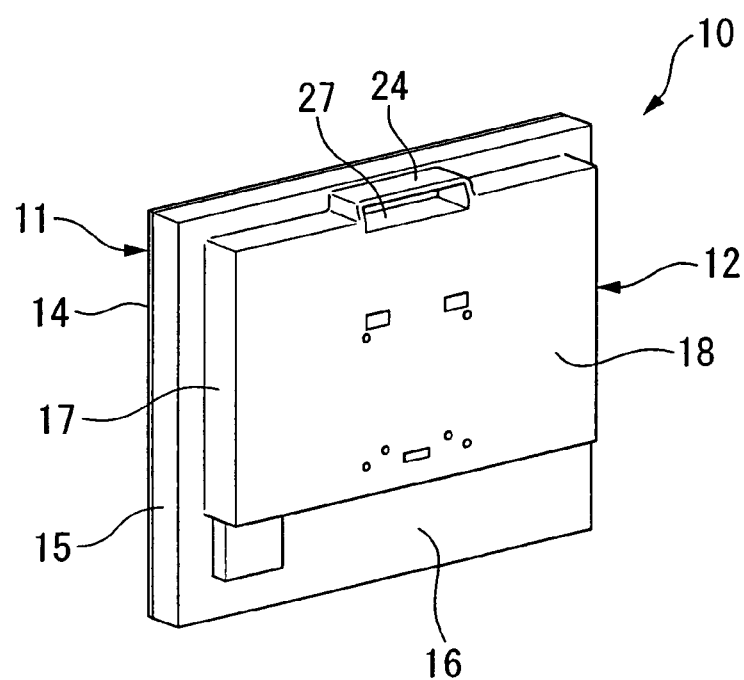
FIG. 2 is a perspective view showing a display unit of an embodiment of the present invention as viewed from a rear surface side.

A display unit 10 of the present embodiment is used, for example, as a display unit of a personal computer. As is shown in FIGS. 1 and 2, in the display unit 10, a rear surface side of a display unit body 11 is covered by a housing 12 that is an integrally molded product made from synthetic resin. In the display unit body 11, a liquid crystal screen (not shown) that provides a display and various types of components are mounted on a substantially box-shaped internal chassis that is made of metal. The periphery of the liquid crystal screen is surrounded by a front cover 14 that is made of resin.

The housing 12 has an outer circumferential frame plate portion 15, an intermediate rear surface plate portion 16, an intermediate frame portion 17, and a rear surface plate portion 18. The outer circumferential frame plate portion 15 is formed in the shape of a horizontally elongated substantially rectangular frame. The intermediate rear surface plate portion 16 extends inwards from the entire circumference of one edge portion of the outer circumferential frame plate portion 15. The intermediate frame portion 17 protrudes in the shape of a substantially rectangular frame from an inner circumferential edge portion of the intermediate rear surface plate portion 16 in the opposite direction from the outer circumferential frame plate portion 15. The rear surface plate portion 18 is located closest to the rear surface side and is formed so as to seal the inner side from the entire circumference of the opposite edge portion of the intermediate frame portion 17 from the intermediate rear surface plate portion 16.

Figure 3:
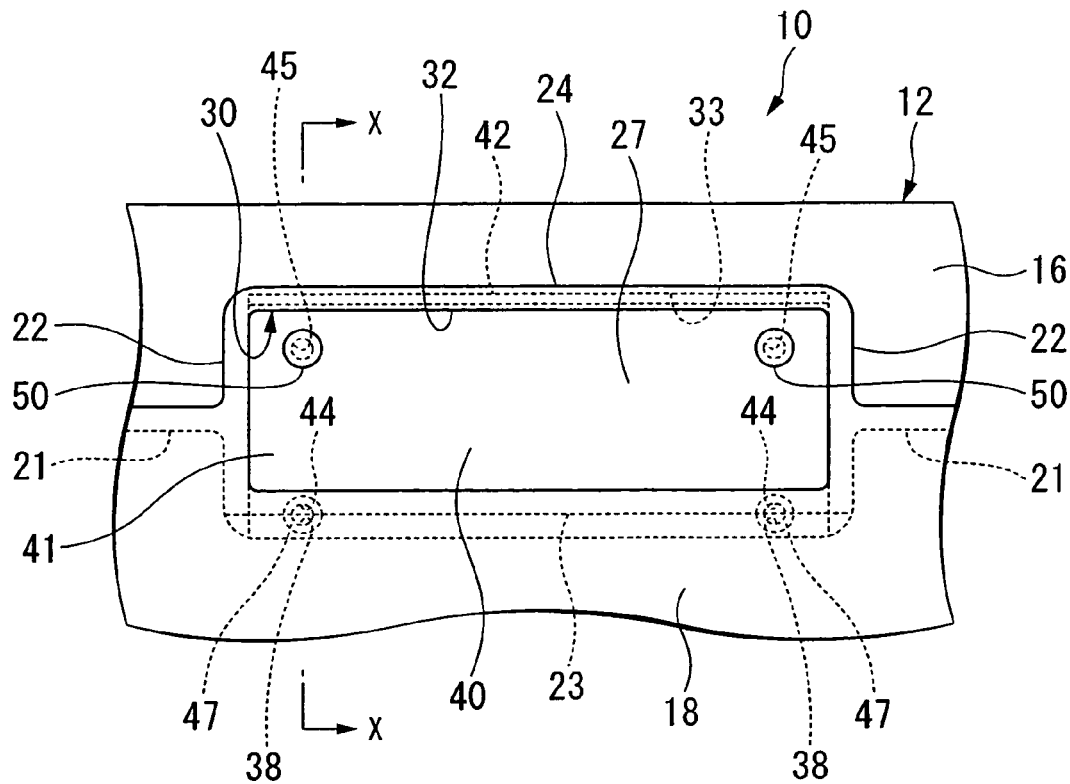
FIG. 3 is an enlarged plan view showing a handle portion of a display unit of an embodiment of the present invention.

Here, as is shown in FIG. 3, a top end portion of the intermediate frame portion 17 has a left and right pair of horizontal plate portions 21 and 21 that extend in the left and right directions on both the left and right sides and that are also placed on the same plane. Between these horizontal plate portions 21 and 21 are provided a pair of vertical plate portions 22 and 22, a bottom plate portion 23, and a handle plate portion (i.e., a handle portion) 24. The pair of vertical plate portions 22 and 22 extend on both sides vertically from the respective sides of the horizontal plate portions 21 and 21 that are adjacent to each other. The bottom plate portion 23 joins together in the left-right direction bottom end portions of the vertical plate portions 22 and 22. The handle plate portion (i.e., handle portion) 24 joins together in the left-right direction top end portions of the vertical plate portions 22 and 22. The pair of vertical plate portions 22 and 22, the bottom plate portion 23, and the handle plate portion 24 are orthogonal to the intermediate rear surface plate portion 16 and rear surface plate portion 18 and are molded as a single unit with the housing 12.

A finger insertion space 27 into which a finger is inserted when the handle plate portion 24 is gripped is formed so as to penetrate from the rear surface side of the housing 12 to the front surface side thereof in an interior portion that is surrounded by the pair of vertical plate portions 22 and 22, the bottom plate portion 23, and the handle plate portion 24. Namely, the finger insertion space 27 is provided extending in the left-right direction at a bottom side of the handle plate portion 24 that is formed integrally with the rear surface side of the housing 12. The handle plate portion 24 of the housing 12 is formed at a position on a top surface of the housing 12 so as to form a single plate shape.

Figure 4:
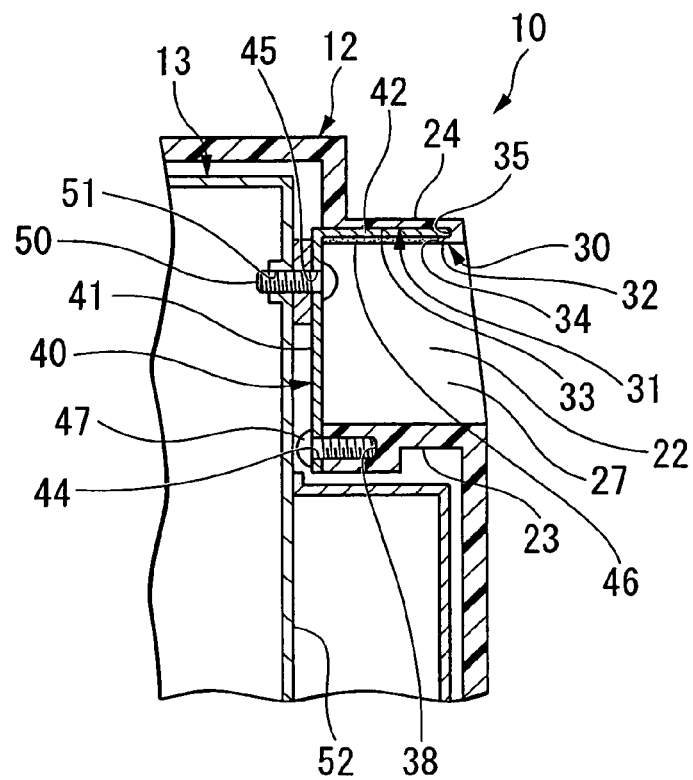
FIG. 4 is a cross-sectional view taken along a line X-X of the display unit of an embodiment of the present invention shown in FIG. 3.

As is shown in FIG. 4, a step portion 31 that is shaped like a step so as to extend upwards to a predetermined height is formed in the interior on a bottom surface 30 of the handle plate portion 24, namely, on the surface that faces the finger insertion space 27. More specifically, an outer side surface portion 32, an inner side surface portion 33, and a step surface portion 34 are formed on the bottom surface 30 of the handle plate portion 24. The outer side surface portion 32 is placed substantially horizontally. The inner side surface portion 33 is provided on an inner side of this outer side surface portion 32, and in parallel with this outer side surface portion 32, and also at a higher position than the outer side surface portion 32. The step surface portion 34 is provided so as to join together the sides of the outer side surface portion 32 and the inner side surface portion 33 that are adjacent to each other, and is perpendicular to the outer side surface portion 32 and the inner side surface portion 33. The step portion 31 is formed by the inner side surface portion 33 and the step surface portion 34. A recessed portion that is hollowed out towards the outer side such that a top surface thereof and the inner side surface portion 33 are flush is formed in the step surface portion 34 so as to extend in the left-right direction for the entire length of the finger insertion space 27.

Screw holes 38 are formed at a plurality of, specifically, two locations to the left and right so as to extend towards the outer side in an inner side of the bottom plate portion 23 that forms a bottom side of the finger insertion space 27.

In the present example, a reinforcing plate (i.e., reinforcing component) 40 that is made from metal, specifically, from steel plate is provided in order to reinforce the handle plate portion 24. This reinforcing plate 40 is sheet metal processed from a plate material so as to have an L-shaped cross section. Namely, the reinforcing plate 40 has a mounting plate portion 41 and a supporting plate portion 42 that are each formed in substantially rectangular shapes that are substantially orthogonal to each other. Screw insertion holes 44 are formed in a plurality of, specifically, two locations on both sides of an end portion of the mounting plate portion 41 on the opposite side from the supporting plate portion 42. Screw insertion holes 45 are also formed in a plurality of, specifically, two locations to the left and right in a central location of the mounting plate portion 41. Furthermore, a non-slip sheet (i.e., non-slip portion) 46 that is made of non-woven cloth or the like and is highly slip-resistant and thermally insulating is adhered to the surface located on the mounting plate portion 41 side of the supporting plate portion 42. The reinforcing plate 40 and the non-slip sheet 46 are the same color base as the housing 12.

When this type of reinforcing plate 40 is mounted on the housing 12, the supporting plate portion 42 is inserted from the inner side of the housing 12 into the finger insertion space 27, and a distal end of the supporting plate portion 42 is fitted into the recessed portion 35 of the handle plate portion 24. In this manner, the mounting plate portion 41 is placed against an inner end surface of the bottom plate portion 23 with the supporting plate portion 42 placed on the bottom surface side of the handle plate portion 24. In this state, a plurality of, specifically, two screws 47 are respectively inserted from the inner side of the housing 12 into the screw insertion holes 44 in the mounting plate portion 41 and are screwed into the screw holes 38 in the bottom plate portion 23. As a result, the reinforcing plate 40 is mounted on the housing 12.

In the reinforcing plate 40 that is in a state of being fixed to the housing 12 as is described above, the supporting plate portion 42 is positioned on the bottom surface 30 side of the handle plate portion 24. Specifically, the supporting plate portion 42 is placed against the inner side surface portion 33 in the step portion 31 that is formed on the inner side of the bottom surface 30 of the handle plate portion 24. The distal end portion of the supporting plate portion 42 is placed in a state of being inserted inside the recessed portion 35 of the handle plate portion 24. At this time, the non-slip sheet 46 that is adhered to the bottom surface of the reinforcing plate 40 is positioned at a slightly higher position than the outer side surface portion 32 of the handle plate portion 24. Moreover, the mounting plate portion 41 blocks off the inner side of the finger insertion portion 27 and forms a bottom portion of the finger insertion portion 27.

The housing 12 having the reinforcing plate 40 mounted thereon is mounted so as to cover the rear surface side of the display unit body 11 and is screwed onto the rear surface side of the display unit body 11. In this state, two screws 50 are inserted from the outer side of the housing 12 individually into the screw insertion holes 45 in the mounting plate portion 41 of the reinforcing plate 40 via the finger insertion space 27, and are screwed into screw holes 51 in the rear surface plate portion 52 of an internal chassis 13. As a result, the reinforcing plate 40 is directly fixed to the internal chassis 13.

According to the display unit 10 of the above described present embodiment, because a reinforcing plate 40 that is made of metal reinforces the handle plate portion 24 that is made of synthetic resin and is formed integrally with the housing 12, strength can be secured without the thickness of the handle plate portion 24 being made thicker. Accordingly, the handle plate portion 24 can be made thin and the degree of freedom of design is improved. Namely, because it is possible to place the handle plate portion 24 at a position on the top surface of the housing 12 so that a single plate shape is formed, an excellent design can be achieved. Moreover, a reduction in the space that is required for the handle plate portion 24 is achieved. In addition, because reinforcement is provided by the metal reinforcing plate 40, any cost increases can be controlled.

Moreover, because the reinforcing plate 40 is provided on the bottom surface 30 side of the handle plate portion 24, the metal reinforcing plate 40, which is made from a different material from that of the housing 12, is not in an easily viewed position. Accordingly, there is no adverse effect on the exterior appearance.

Furthermore, because the reinforcing plate 40 is placed in the step portion 31 that is formed on the interior side of the bottom surface 30 of the handle plate portion 24, it is even more difficult to see the metal reinforcing plate 40 and it is possible to reliably prevent the exterior appearance from being adversely affected.

In addition, because the outer end portion of the reinforcing plate 40 is inserted inside the recessed portion 35 of the housing 12, the outer end portion of the reinforcing plate 40 can be reliably prevented from being exposed.

Moreover, because the non-slip sheet is provided on the reinforcing plate 40, the ease of gripping the handle is improved.

Furthermore, because the reinforcing plate 40 is mounted on the housing 12, the reinforcing plate 40 can be mounted on the housing 12 and then handled so that there is an improvement in the ease of handling thereof. Namely, by mounting the reinforcing plate 40 on the housing 12 in advance, subsequent handling becomes easy.

In addition, because the reinforcing plate 40 is fixed to the metal internal chassis 13 that is provided inside the housing 12, it is possible to even more reliably reinforce the resin handle plate portion 24.

As has been described above, according to the present invention, because a handle portion that is made of synthetic resin and is formed integrally with a housing is reinforced by a reinforcing component that is made of metal, strength can be secured without the thickness of the handle portion being made thicker. Accordingly, the handle portion can be made thin and the degree of freedom of design is improved. Moreover, a reduction in the space that is required for the handle portion is achieved. In addition, because reinforcement is provided by the metal reinforcing component, any cost increases can be controlled.

While the preferred embodiment of the invention has been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A display unit comprising:
   a handle portion that is formed integrally with a rear surface side of a housing that is made from synthetic resin and that has a finger insertion space provided in a bottom side thereof; and
   a reinforcing component that is made of metal and is mounted in the finger insertion space of the handle portion, the reinforcing component being affixed to the housing at a first end of the reinforcing component and affixed to an internal chassis of the display at a second end of the reinforcing component.

2. The display unit according to claim 1, wherein the reinforcing component is provided at a bottom surface side of the handle portion.

3. The display unit according to claim 2, further comprising a step portion that is formed on an interior side of the bottom surface of the handle portion and has a step shape on its upper side, the reinforcing component being placed in the step portion.

4. The display unit according to claim 2, wherein a non-slip portion is provided on a bottom surface of the reinforcing component.

5. The display unit according to claim 1, wherein the reinforcing component is mounted on the housing.

6. The display unit according to claim 1, wherein the internal chassis is made of metal and is provided inside the housing.

7. The display unit according to claim 1, wherein the handle portion is formed at a position on a top surface of the housing so as to form a single plate shape.

* * * * *